United States Patent
Suh et al.

(10) Patent No.: US 11,949,480 B2
(45) Date of Patent: Apr. 2, 2024

(54) METHOD AND SYSTEM FOR CHANNEL STATE INFORMATION FEEDBACK USING SUB-CODEBOOK BASED TRELLIS CODED QUANTIZATION

(71) Applicant: HUAWEI TECHNOLOGIES CO., LTD., Shenzhen (CN)

(72) Inventors: Jung Hoon Suh, Kanata (CA); Yan Xin, Kanata (CA); Osama Aboul-Magd, Kanata (CA); Kwok Shum Au, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 250 days.

(21) Appl. No.: 17/307,031

(22) Filed: May 4, 2021

(65) Prior Publication Data
US 2022/0360305 A1 Nov. 10, 2022

(51) Int. Cl.
*H04B 7/06* (2006.01)
*H04L 1/00* (2006.01)
*H04L 25/03* (2006.01)

(52) U.S. Cl.
CPC ......... *H04B 7/0626* (2013.01); *H04L 1/0054* (2013.01); *H04L 1/006* (2013.01); *H04L 25/03898* (2013.01)

(58) Field of Classification Search
None
See application file for complete search history.

(56) References Cited

U.S. PATENT DOCUMENTS

| | | | | |
|---|---|---|---|---|
| 7,414,549 B1 * | 8/2008 | Yang | ................. | H03M 13/1102 341/87 |
| 2008/0232501 A1 * | 9/2008 | Khojastepour | ...... | H04B 7/0417 375/267 |

(Continued)

FOREIGN PATENT DOCUMENTS

| | | |
|---|---|---|
| CN | 103023550 A | 4/2013 |
| CN | 105379335 A | 3/2016 |

(Continued)

OTHER PUBLICATIONS

Marcellin et. al., "Trellis Coded Quantization of Memoryless and Gauss-Markov Sources", IEEE Transactions on Communications, vol. 38, No. 1, Jan. 1990, pp. 82-93.

(Continued)

*Primary Examiner* — Christopher T Wyllie

(57) ABSTRACT

Aspects of the disclosure provide for methods and systems for Sub-codebook based Trellis Coded Quantization for CSI Feedback. An aspect of the disclosure provides method executed by a receiver. The method includes receiving a signal from a transmitter, via a communication channel between the receiver and the transmitter. The method further includes estimating parameters associated with the channel based on the received signal. The method further includes obtaining phase information from the estimated parameters. The method further includes applying a trellis coded quantization (TCQ) scheme to the obtained phase information by mapping each sub-codebook index of a set of sub-codebook indices to output bits of each trellis branch making the distance between sub-codebooks maximally equal. The method further includes transmitting a channel state information (CSI) measurement feedback to the transmitter, the CSI measurement feedback based on the TCQ scheme and (Continued)

comprising one or more of: a beginning state, input bits to the TCQ scheme, and a sub-codebook index.

20 Claims, 12 Drawing Sheets

(56) References Cited

U.S. PATENT DOCUMENTS

| | | | |
|---|---|---|---|
| 2013/0315501 A1* | 11/2013 | Atanassov | G01B 11/2545 |
| | | | 382/275 |
| 2015/0023440 A1* | 1/2015 | Suh | H04L 1/0073 |
| | | | 375/267 |
| 2015/0124894 A1* | 5/2015 | Suh | H04B 7/0417 |
| | | | 375/260 |
| 2016/0267671 A1* | 9/2016 | Atanassov | G06F 18/22 |
| 2017/0078010 A1* | 3/2017 | Suh | H04B 7/0619 |
| 2022/0360305 A1* | 11/2022 | Suh | H03M 13/6337 |

FOREIGN PATENT DOCUMENTS

| | | |
|---|---|---|
| CN | 106301493 A | 1/2017 |
| EP | 1956730 A2 | 8/2008 |
| WO | 2015093918 A1 | 6/2015 |

OTHER PUBLICATIONS

Zhang et. al., "Trellis-Coded Quantization of Phases in MISO Wireless Systems", TELKOMNIKA, vol. 10, No. 7, Nov. 2012, pp. 1808-1814.

* cited by examiner

|  | MSE ($E(q^2)$) | SQNR (dB) |
|---|---|---|
| TCQ | $3.98e^{-5}$ | 52.673 |
| SQ | $4.97e^{-5}$ | 51.7089 |

FIG. 8

| | MSE ($E(q^2)$) | SQNR (dB) |
|---|---|---|
| TCQ | $2.236e^{-4}$ | 53.5077 |
| SQ | $2.894e^{-4}$ | 52.3948 |

FIG. 10

METHOD AND SYSTEM FOR CHANNEL STATE INFORMATION FEEDBACK USING SUB-CODEBOOK BASED TRELLIS CODED QUANTIZATION

CROSS-REFERENCE TO RELATED APPLICATIONS

This is the first application filed for the present invention.

FIELD OF THE INVENTION

The present invention pertains to the field of communication networks, and in particular to methods and systems for channel state information (CSI) feedback.

BACKGROUND

Efforts have been put into improving wireless communication systems including capacity enhancements. One approach for improving wireless communication system has been from the perspective of channel state information (CSI) and its feedback schemes. CSI represents the combined effect of scattering, fading, power attenuation of the wireless medium and the motions of objects. CSI may be mathematically represented in a complex number. Current channel feedback schemes limit transmission beamforming design due to channel information loss and bandwidth requirements. A further challenge in the context of CSI is quantization of the full CSI feedback. Communication systems with a more precise channel knowledge without loss of information are more desirable to allow for a more bandwidth efficient approach. A more bandwidth-efficient approach may further liberate channel resources for other uses.

Therefore, there is a need for methods and apparatus that obviates or mitigates one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

An aspect of the disclosure provides method executed by a receiver. The method includes receiving a signal from a transmitter, via a communication channel between the receiver and the transmitter. The method further includes estimating parameters associated with the channel based on the received signal. The method further includes obtaining phase information from the estimated parameters. The method further includes applying a trellis coded quantization (TCQ) scheme to the obtained phase information by mapping each sub-codebook index of a set of sub-codebook indices to output bits of each trellis branch making the distance between sub-codebooks maximally equal. The method further includes transmitting a channel state information (CSI) measurement feedback to the transmitter, the CSI measurement feedback based on the TCQ scheme and comprising one or more of: a beginning state, input bits to the TCQ scheme, and a sub-codebook index. In some embodiments, the method further includes executing a Viterbi algorithm (VA) to obtain the CSI measurement feedback. In some embodiments, the set of sub-codebook indices comprises 4 sub-codebook indices.

In some embodiments, each sub-codebook of the set of sub-codebooks comprises a set of codewords generated via:

$c_{i,l} = L_b + l\Delta + (i + 0.5)\delta$, wherein:

$c_{i,l}$ is the $l$-th codeword in sub-codebook $C_i$, $i$-th ($0 <= i <= 3$) sub-codebook is denoted as $C_i$;

$C_i = \{c_{i,l}\}_{l=0}^{\frac{N}{2}-1}$;

$c_{i,l} = L_b + l\Delta + (i + 0.5)\delta$;

$N = 2^n$;

$n$ = bit size of the TCQ scheme;

$\Delta = \dfrac{U_b - L_b}{N/2}$;

$\delta = \dfrac{U_b - L_b}{2N}$;

and $L_b$ and $U_b$ are, respectively, lower bound and upper bound of the obtained phase information.

In some embodiments, $L_b$ is $-\pi$ and $U_b$ is $\pi$.

In some embodiments, the TCQ scheme has a code-rate of ½. In some embodiments, the input bits indicate a survival path from the beginning state.

Another aspect of the disclosure provides method executed by a receiver. The method includes receiving a signal from a transmitter, via a communication channel between the receiver and the transmitter. Such a method includes estimating parameters associated with the channel based on the received signal. The method further includes obtaining magnitude information from the estimated parameters. The method further includes converting the magnitude information from Rayleigh distribution to uniform distribution. The method further includes applying a trellis coded quantization (TCQ) scheme to the converted magnitude information by mapping each sub-codebook index of a set of sub-codebook indices to output bits of each trellis branch in order to make the distance between sub-codebooks maximally equal. The method further includes transmitting a channel state information (CSI) measurement feedback to the transmitter, the CSI measurement feedback based on the TCQ scheme and comprising one or more of: a beginning state, input bits to the TCQ scheme, and a sub-codebook index.

In some embodiments, the method further includes further comprising: executing a Viterbi algorithm (VA) to obtain the CSI measurement feedback. In some embodiments, the set of sub-codebook indices comprises 4 sub-codebook indices.

In some embodiments, sub-codebook of the set of sub-codebooks comprises a set of codewords generated via:

$c_{i,l} = L_b + l\Delta + (i + 0.5)\delta$, wherein:

$c_{i,l}$ is the $l$-th codeword in sub-codebook $C_i$, $i$-th ($0 <= i <= 3$) sub-codebook is denoted as $C_i$;

$C_i = \{c_{i,l}\}_{l=0}^{\frac{N}{2}-1}$;

$c_{i,l} = L_b + l\Delta + (i + 0.5)\delta$;

$N = 2^n$;

-continued n = bit size of the TCQ scheme;

$$\Delta = \frac{U_b - L_b}{N/2};$$

$$\delta = \frac{U_b - L_b}{2N};$$

and $L_b$ and $U_b$ are, respectively, lower bound and upper bound of the converted magnitude information.

In some embodiments, $L_b$ is 0 and $U_b$ is 1.

In some embodiments, the converting is performed via:

$$U = e^{-\frac{x^2}{(2\sigma^2)}},$$

wherein:

U is the converted magnitude information uniformly distributed between 0 and 1;

σ is a scaling factor as determined according to:

$$\sigma = \frac{\mu(x)}{\sqrt{\pi/2}};$$

μ(x) is an average over an OFDM symbol for a portion of the magnitude information from each measured CSI per sub-carrier; and x is the magnitude information.

In some embodiments, transmitting includes transmitting the scaling factor. In some embodiments, the scaling factor is quantized once per sensing frame. In some embodiments, the scaling factor comprises an integer part and a decimal part. In some embodiments, the integer part and the decimal part are quantized separately. In some embodiments, decimal part is quantized using a scalar quantization. In some embodiments, the method further includes: recovering, by the transmitter, the converted magnitude information; and reconverting the magnitude information according to: $x=\sigma\sqrt{-2\ln U}$.

Other aspects of the disclosure provide devices and systems for implementing the described methods. For example, another aspect of the disclosure provides a wireless device. Such a wireless device includes a receiver; a processor; and a non-transitory memory. The non-transitory memory stores machine executable instructions, which when executed by the processor, configures the device for implementing the above described methods.

Embodiments have been described above in conjunctions with aspects of the present invention upon which they can be implemented. Those skilled in the art will appreciate that embodiments may be implemented in conjunction with the aspect with which they are described but may also be implemented with other embodiments of that aspect. When embodiments are mutually exclusive, or are otherwise incompatible with each other, it will be apparent to those skilled in the art. Some embodiments may be described in relation to one aspect, but may also be applicable to other aspects, as will be apparent to those of skill in the art.

BRIEF DESCRIPTION OF THE FIGURES

Further features and advantages of the present invention will become apparent from the following detailed description, taken in combination with the appended drawings, in which:

FIG. 8 illustrates performance metric between TCQ and scalar quantization (SQ), according to an embodiment of the present disclosure.

FIG. 10 illustrates performance metric between TCQ and scalar quantization (SQ), according to an embodiment of the present disclosure.

It will be noted that throughout the appended drawings, like features are identified by like reference numerals.

DETAILED DESCRIPTION

Figure 1:
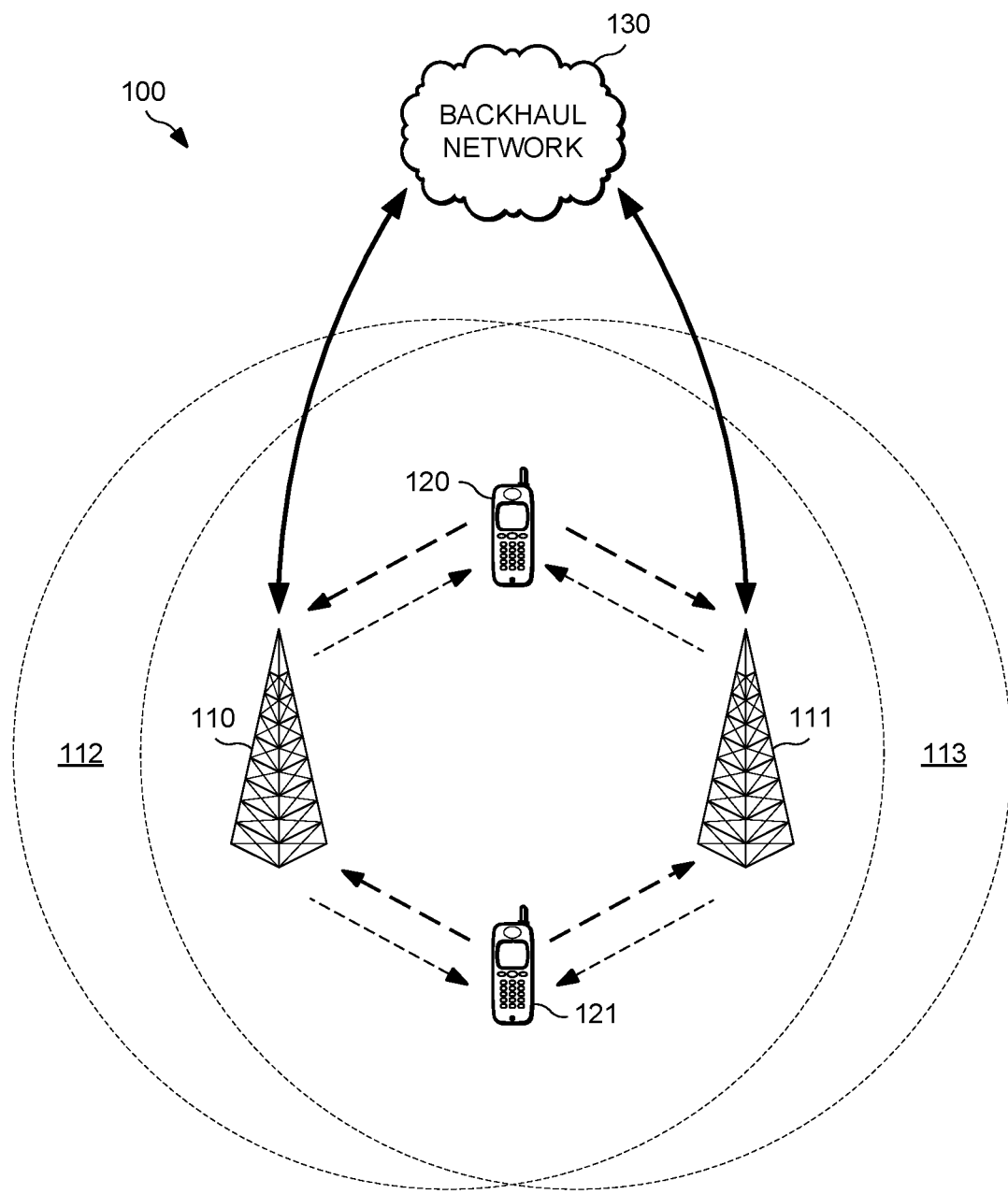
FIG. 1 illustrates an example communication system 100, according to an embodiment of the present disclosure.

Trellis Coded Quantization (TCQ) has been proposed for quantizing channel feedback, including identifying samples of quantized and estimating channel parameters. For example, the TCQ based Channel State Information (CSI) feedback using the Back-Trace Viterbi Algorithm (VA), that is, the Feedback (FB) with the beginning state and the Trellis Code Input Bits, has been proposed.

Under another proposed TCQ based CSI FB, the station (STA) which feedbacks the TCQ based CSI may know which sub-carrier may have a larger Mean Squared Quantization Error (MSE), so the STA feedbacks the TCQ based CSI along with the sub-carrier index with the large MSE beyond a certain threshold. The Beamformer (usually the AP), which receives the feedback along with the sub-carrier index with the large MSE, may check the sub-carrier index and run an interpolation algorithm to recover the quantized value for that sub-carrier index. As may be appreciated by a person skilled in the art, such proposed TCQ based CSI FB may apply to any type of samples regardless of probability distributions, while the current compressed beamforming FB scheme in Wi-Fi 5 through 7 (802.11ac/ax/be) was proposed for the uniformly-distributed angle quantization. However, existing FB schemes do not show a performance gain compared to Scalar Quantization (SQ). According, embodiments provide for sub-codebook based TCQ which may provide for approximately 1 dB Source to Quantization Noise Ratio (SQNR) gain.

The full CSI is one of sensing measurement types for sub 7 GHz band in 802.11bf. The CSI represents the combined effect of scattering, fading, power attenuation of the wireless medium and the motions of objects. The CSI may be mathematically represented in a complex number, and thus, can be transformed into magnitude and phase values.

The phase samples may be uniformly distributed. The magnitude may be approximately Rayleigh-distributed. Determining how to extract the information caused by the motions of objects inherent to the measured CSI information may be implementation specific. Full CSI feedback is important since 802.11 focuses on how to feedback the measured CSI information with minimized loss of information. Accordingly, embodiments may provide for a sub-codebook based TCQ for the full CSI FB.

The 802.11ac/ax/be CSI FB scheme may be referred to a compressed beamforming (BF) FB. As may be appreciated by a person skilled in the art, the measured CSI may be derived via a singular-value-decomposition (SVD) operation and may be represented in a multiplication of the Left-singular matrix, Eigen-value matrix and the Right-singular matrix.

The Eigen-values may be fed back in the average SNR per OFDM symbol and Stream, and in the delta SNR per every other sub-carrier.

The Right-singular matrix may be fed back in a series of angle-quantized Givens rotation matrix. A scalar quantization may be used for the angle-quantization (angle samples are uniformly distributed, as may be appreciated by a person skilled in the art). The Left-singular matrix may not be fed back, because it is a unitary matrix with phase information only which may not impact the Beamforming Steering matrix.

The compressed BF FB may cause information loss and, hence, may not be always appropriate for Sensing Signal Analysis, among other applications. As may be appreciated by a person skilled in the art, a full CSI FB, without loss of information, is desirable for sensing and other applications. Accordingly, quantizing a full CSI FB is a challenge, for which, embodiments described herein may provide a solution.

Embodiments of the present invention are described herein with respect to example embodiments in a particular context, namely wireless communication systems that use channel state information to facilitate advanced beamforming (BF) techniques or advanced communication techniques. Embodiments of the present invention may be applied to standards-compliant communication systems, such as those that are compliant with standards set by the Third Generation Partnership Project (3GPP), IEEE 802.11, or the like.

Generally, in order to obtain channel state information, a transmitter (such as an Access Point (AP) when it is transmitting to a station in a downlink or station when it is transmitting to AP in an uplink) transmits to a receiver over a communication channel (or link) and the receiver utilizes the transmission to measure the communication channel. The receiver may use the channel measurement to derive channel state information and transmits the channel state information (or a function thereof) to the transmitter. The channel state information is included in the channel feedback provided from the receiver to the transmitter. The transmitter may use the channel feedback to adjust its transmitter to fully exploit advanced communication techniques, such as BF, multiple user (MU) multiple-input multiple-output MIMO, single user MIMO, and the like.

In general, transmitters that are to use advanced communications techniques require information about the communication channels, such as MIMO channels, for transmitter beamforming (TxBF). This may apply when advanced communications techniques, such as non-linear precoded MIMO, are to be applied, since full channel knowledge is desirable to be known at the transmitter. However, cost may be an issue. The more accurate the channel knowledge, the larger the size of the channel feedback. Thereby increasing communication overhead and reducing communication system efficiency.

FIG. 1 illustrates an example communication system 100, according to an embodiment of the present disclosure. Communication system 100 may include access points (APs) 110 and 111. As shown in FIG. 1, the APs can have overlapping coverage areas (coverage area 112 corresponding to AP 110 and coverage area 113 corresponding to AP 111). The APs may serve STAs 120 and 121. Utilizing advanced communication techniques, a device may communicate with multiple APs. As shown in FIG. 1, station 120 may communicate with both AP 110 and AP 111. Similarly, station 121 may communicate with both AP 110 and AP 111. Transmissions from an AP to a station may be referred to as downlink (DL) communications, and transmissions from a station to an AP may be referred to as uplink (UL) communications. The APs may be connected to a backhaul network 130, which may provide functionality support such as mobility, authentication, authorization, as well as services, including data, information, and multimedia. In various embodiments, an AP may correspond to a base station, a NodeB, an evolved NodeB (eNB), a controller, a communication controller, or a similar device. Similarly, a station may be commonly referred to as a mobile station, a mobile, a subscriber, a user, a terminal, or a user equipment (UE).

While it is understood that communication systems may employ multiple APs capable of communicating with a number of stations, only two APs, and a number of UEs are illustrated for simplicity.

Figure 2:
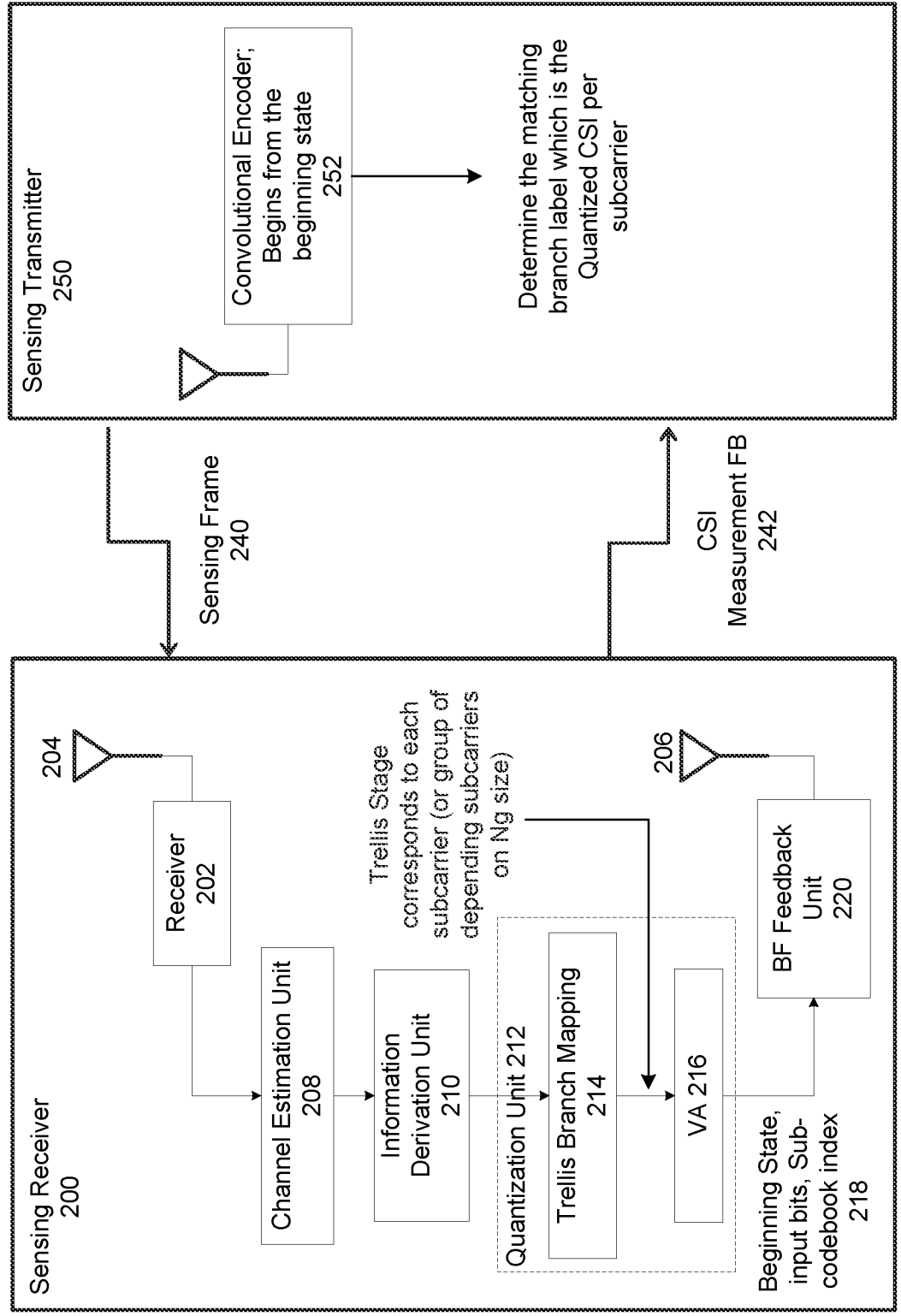
FIG. 2 illustrates a system according to an embodiment of the present disclosure.

FIG. 2 illustrates a system according to an embodiment of the present disclosure. The system includes a first device, e.g., a sensing receiver 200 or a receiver, and a second device, e.g., sensing transmitter 250 or a transmitter, in wireless communication with each other. The first device may run a convolutional decoder, such as a Viterbi decoder, to compute outputs including one or more of beginning state, input bits, and a sub-codebook index. The first device may feedback the outputs to the second device as CSI measurement FB. After receiving the CSI FB, the second device may run a convolutional encoder using the received information, i.e., fed-back beginning state, input bits and the sub-codebook index, to recover the matching branch-label which is the quantized CSI per subcarrier.

The first device, which may be a STA, may receive, via a receiver 204 (and via a receiver antenna 204) a sensing frame 240, transmitted by the second device 250. The first device 200 may transmit, via a transmitter 206, CSI measurement FB 242 to the second device 250. The second device 250 may be an access point, for example.

The first device 200 may include a channel estimation unit 208 configured to estimate channel parameters based on the received sensing frame 240. The first device 200 may further include an information derivation unit 210 configured to receive, from the channel estimation unit. Trellis stage mapping may involve mapping Sub-codebook index to output bits of each trellis branch, making the distance between Sub-codebooks maximally equal. Alternatively, trellis branch mapping may be performed by a separate module or sub-function outside of the quantization unit. As may be appreciated by a person skilled in the art, each trellis stage may correspond to a respective sub-carrier (or group of subcarriers depending on Ng size). The Ng here means the size of sub-carrier groups. It should be appreciated that the term maximally equal means there are substantially equal distances between the branches, where each distance is extended as maximum as possible.

The one or more of the beginning state, input bits and sub-codebook index 218 may be passed to a BF feedback unit 220 of the first device and transmitted from a transmitter 206 of the first device to a receiver of the second device 250 as the CSI measurement FB 242.

The second device 250 may include a convolutional encoder 252, which may periodically receive the CSI measurement FB 242, namely the beginning state, input bits, and sub-codebook index.

The convolutional encoder 252 may then determine its outputs starting from the fed-back beginning state. The convolutional encoder outputs the matching branch label to each trellis stage, which corresponds to the quantization level per sub-carrier. Then, the second device may recover the one or more of phase representation and magnitude representation of the CSI.

It should be noted that the various units of the first device and second device, respectively, may be provided as aspects of common computing resources of the respective devices. For example, the first device can include a microprocessor operatively coupled to memory, or other electronic hardware, configured to execute the operations of one or multiple units as described above.

While embodiments may be described in reference to sensing systems, a person skilled in the art may appreciate that embodiments may apply to any CSI quantization.

Figure 3:
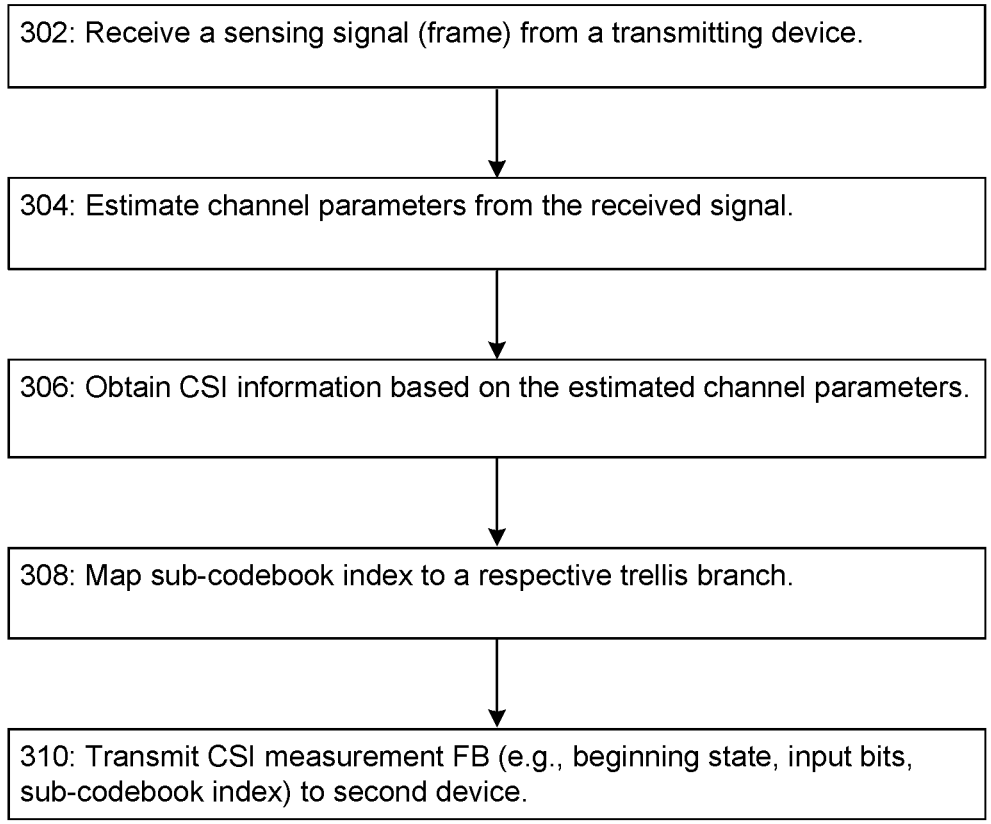
FIG. 3 illustrates operations occurring at a first device acting as a providing CSI measurement feedback to a transmitter, according to an embodiment of the present disclosure.

FIG. 3 illustrates operations occurring at a first device acting as a receiver (e. g., receiver 200) providing CSI measurement feedback to a transmitter, according to an embodiment of the present disclosure. The first device may be, for example, a UE or station in a downlink transmission or an eNB or AP in an uplink transmission, as the receiver provides channel feedback to a transmitter, such as an eNB or AP in a downlink transmission or a UE or station in an uplink transmission.

The operations at the first device may include, at 302, receiving, from a transmitting device (e.g., transmitter 250) a sensing signal (frame). The signal may be a reference signal that is known to the receiver that is transmitted by the transmitter to assist the receiver in making its measurement of the channel.

The operations at the first device may further include, at 304, estimating channel parameters from the received signal. The first device may use the signal transmitted by the transmitter to measure the channel. Since the signal transmitted by the transmitter may be known by the reception (e.g., the receiver knows the transmit power level, as well as properties of the signal), the receiver may be able to estimate the channel using the signal and the measurement of the channel, producing estimated channel parameters.

The operations at the first device may further include, at 306, obtaining phase information or the magnitude information converted into the uniformly distributed samples based on the estimated channel parameters.

The operations at the first device may further include, at 308, mapping sub-codebook index to a respective trellis branch. The trellis can be characterized using forward and backward state transition functions for example as given by Equations (2) and (3) set forth below. Mapping, at 308, may involve mapping Sub-codebook index to output bits of each trellis branch, making the distance between Sub-codebooks maximally equal.

According to an example embodiment, the quantization of the channel parameters may be achieved using a Viterbi algorithm (VA) that corresponds to the TCQ technique. The VA used may be specific to the trellis selected for use in the TCQ technique. As an illustrative example, the size (e.g., number of states, and number of branches), quantization levels, branch mappings, and the like, may determine the VA used. As a result of mapping, the first device may determine, via the Viterbi Algorithm 216, one or more of the beginning state, input bits and sub-codebook index 218.

The operations at the first device may further include, at 310, transmitting CSI measurement FB (e.g., one or more of the beginning state, input bits and sub-codebook index) to the transmitter (second) device (e.g., sensing transmitter 250). As may be appreciated by a person skilled in the art, the size of the CSI measurement FB may depend on one or more of the number of states in the trellis, the trellis length, and the number of branches per state of the trellis.

Figure 4:
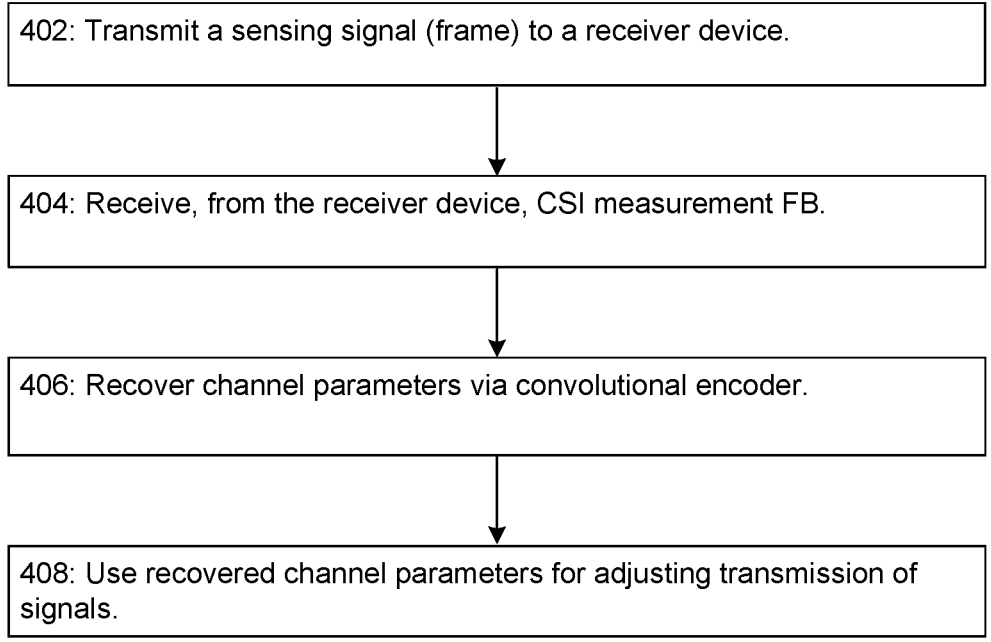
FIG. 4 illustrates operations occurring at a second device acting as a transmitter and for receiving CSI measurement feedback, according to an embodiment of the present disclosure.

FIG. 4 illustrates operations occurring at a second device acting as a transmitter and for receiving CSI measurement feedback, according to an embodiment of the present disclosure. The second device may use the received CSI measurement FB to adjust transmission operations, for example, by using the channel feedback for sensing signal analysis or beamforming. The second device may be an eNB or AP in a downlink transmission or a UE or station in an uplink transmission.

The operations at the second device may include, at 402, transmitting a signal to a first device. The signal may be a reference signal that is known by the receiver (first device) to assist the receiver in making measurements of a channel between the transmitter and the receiver. Alternatively, the signal may be regular transmissions from the transmitter to the receiver.

The operations at the second device may further include, at 404, receiving, from the receiver (first) device, CSI measurement FB. The operations at the second device may further include, at 406, recovering the channel parameters via convolutional encoder. The second device may recover channel parameters from the received CSI measurement FB.

In some embodiments, recovering the channel parameters can include operating 415 a convolutional encoder configured to use a copy of the same trellis having the same branch labels associated with parameters as described in FIG. 3 (to recover the matching branch-label which is the quantized CSI per subcarrier).

For the operation of Viterbi decoder and its corresponding Convolutional Encoder, the current 802.11 binary convolutional codes (BCC) trellis scheme may be used.

Embodiments of the present invention involve applying a TCQ scheme. The TCQ scheme maps the given set of parameters to a trellis code representation thereof.

Applying the TCQ scheme involves the use of a trellis having a given number of stages, states per stage, and branches per state. The number of stages may be equal to one greater than the number of parameters to be quantized. The number of branches per state may be an integer multiple of two. In a balanced, uniform trellis, each state in all but the last stage has the same number of branches leading therefrom, and each state in all but the first stage has this same number of branches leading thereto.

As an illustrative example, for a trellis with N states per stage and B branches per state the trellis may be described with a forward state transition function, which may be expressed as:

$$S_i = (B*S_{i-1})\%N + u_i, u_i \in \{0, 1, \ldots B-1\}$$

Where B is 2 and N is 64, $S_i = (2*S_{i-1})\%64 + u_i$    (1)

$S_{i-1}$ may be a variable representing the states index in the $(i-1)^{st}$ trellis stage. $S_i$ may represent the state index in the $i^{th}$ trellis stage. $u_i$ may represent the input bit at the $i^{th}$ trellis stage. Other values for B and N may be used as may be appreciated by a person skilled in the art. As used herein, the "%" operation refers to the modulo operation. The above state transition function defines the structure of the trellis branches, as further described herein. Namely, a branch exists from trellis state $S_{i-1}$ to trellis state $S_i$ whenever Equation (2) is satisfied with $u_i=0$ or $u_i=1$.

A backward state transition function for the Back-Tracing Viterbi Algorithm (VA) can similarly be defined for the trellis as:

$$S_{i-1} = f(S_i, u_b) = \lfloor S_i/B \rfloor + N/B*u_b, u_b \in \{0, 1, \ldots B-1\}$$

Where B is 2 and N is 64: $S_{i-1} = (S_i/2) + 32*u_b$    (2)

The backward state transition function may be used to reach a branch-connected trellis state $S_{i-1}$ in the $(i-1)^{st}$ trellis stage from trellis state $S_i$ in the $i^{th}$ trellis stage. Here, $u_b$ may indicate the high or low state of $S_{i-1}$, which may represent the survival branch information for the backward trellis transition.

It will be readily understood by a worker skilled in the art that trellises with different numbers of states and/or different numbers of branches per state can be provided.

Figure 5:
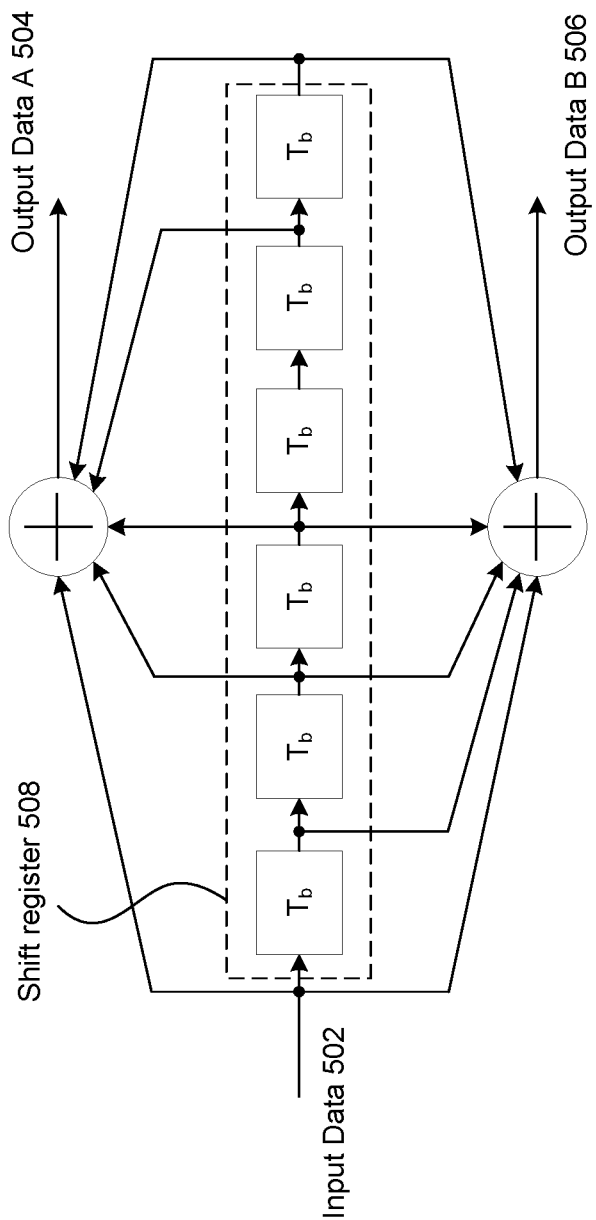
FIG. 5 illustrates a binary convolutional codes (BCC) trellis scheme, according to an embodiment of the present disclosure.

FIG. 5 illustrates a binary convolutional codes (BCC) trellis scheme, according to an embodiment of the present disclosure. The BCC trellis scheme illustrated may be similar to the 802.11 BCC trellis scheme. For each input data 502, the BCC trellis scheme may generate two output bits in each trellis stage (for rate ½ code), output data A 504 and output data B 506. The state of the trellis may be determined by the binary bits occupying the shift register 508. Based on the state of shift register 508 and the modulo combination, a 2-bit output, output data A 504 and output data B 506 may be determined. Accordingly, for each 1-bit input, input data 502, a two-bit output, output data A 504 and output data B 506, may be determined.

FIG. 5 may be uniquely represented by the forward state transition function, equation (2) herein and the backward state transition function, equation (3) herein.

As may be appreciated by a person skilled in the art, the output of the VA along with the beginning state may determine the output bits of the trellis through the Convolutional Encoder which corresponds to the unique sub-codebook index.

For the rate ½ code, the output bit of VA which may be the input bit to the Convolutional encoder per trellis stage is 1 bit. Since there are two output bits in each trellis stage with the rate ½ code, there are four sub-codebooks corresponding to these two output bits in each trellis stage.

The output bits over all trellis stages, and the beginning state of the survival path may determine the unique sub-codebook index. The size of each sub-codebook is $2^{n-1}$ where n is the feedback bit size per trellis stage.

Embodiments will now describe how to generate the sub-codebooks for a uniformly-distributed source such as the phase information of CSI.

For an n-bit TCQ quantizer, the codebook may be divided into four sub-codebooks, each with N/2 codewords, where $N=2^n$. As may be appreciated by a person skilled in the art, since the code rate for the trellis scheme is ½, there may be four sub-codebooks.

The i-th (0<=i<=3) sub-codebook may be denoted as follows:

$$C_i = \{c_{i,l}\}_{l=0}^{\frac{N}{2}-1}$$    (3)

where $c_{i,l}$ is the l-th codeword in $C_i$.

These sub-codebooks may be generated as follows. $L_b$ and $U_b$ may be the lower and upper bounds, respectively, of source data samples (e.g., phase information of CSI) to be quantized. Provided $$\Delta = \frac{U_b - L_b}{N/2}, \text{ and } \delta = \frac{\Delta}{4} = \frac{U_b - L_b}{2N},$$

then $$C_{i,l} = L_b + l\Delta + (i+0.5)\delta$$    (4)

The sub-codebooks may be mapped to the output bits of the trellis. Since there may be two output bits for each input bit, the output bits may comprise one of the following: 00, 01, 10, or 11.

Depending on the trellis scheme, the $C_i$ may be re-arranged to make the distance between $C_i$s maximally equal when mapped to the trellis output bits. In order to make the distances among sub-codebooks maximally equal, $C_0$ may correspond to the output bit 00, $C_1$ may correspond to the output bit 01, $C_2$ may correspond to the output bit 11, and $C_3$ may correspond to the output bit 10 (e.g., for the case of the 802.11 convolutional scheme).

In an example, sub-codebook of an 8-bit TCQ may be computed. The source data to be quantized may be uniformly distributed between $-\pi(L_b)$ and $\pi(U_b)$. The N is defined as $N=2^8=256$. There may be 4 sub-codebooks with N/2=128 codewords in each sub-codebook. Each codeword may be indicated by an index, which may be referred to as codeword index. Accordingly, depending on the number of codewords, an appropriate bit size may be used to indicate the codeword index (e.g., for 128 codewords, 7-bit is sufficient, for 2 codewords, 1-bit is sufficient).

Using equation (4), $C_0$ to $C_3$ may be obtained as follows: $C_0=\{-3.135456731, -3.086369346, \ldots, 3.049553779, 3.098641164\}$; $C_1=\{-3.123184885, -3.0740975, \ldots, 3.061825625, 3.11091301\}$; $C_2=\{-3.110913039, -3.061825654, \ldots, 3.074097471, 3.123184856\}$; and $C_3=\{-3.098641193, -3.049553808, \ldots, 3.086369317, 3.135456702\}$.

The $L_b$ and $U_b$ values may correspond to $-\pi$ and $\pi$ respectively, where $\pi$ is 3.14159265359.

Figure 6:
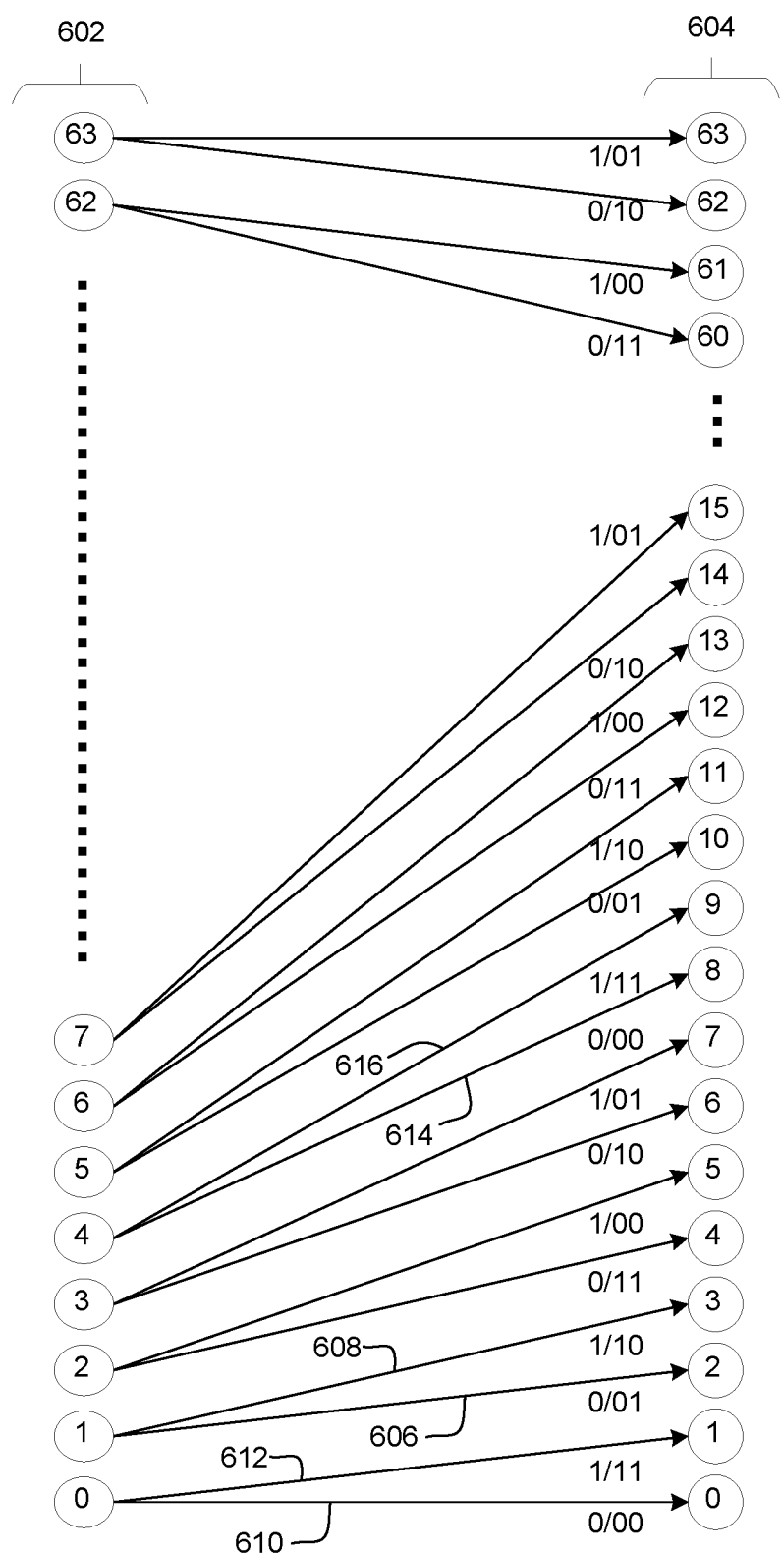
FIG. 6 illustrates a trellis diagram according to an embodiment of the present disclosure.

The subscript i in $C_i$ may correspond to the output bits in a state transition, and the 00 is paired with 11 and 01 is paired with 10 in the outgoing branches from a state as we see from FIG. 6. In order to make the distances among sub-codebooks maximally equal, $C_0$ may be mapped to the output bit 00, $C_1$ may be mapped to the output bit 01, $C_2$ may be mapped to the output bit 11, and $C_3$ may be mapped to the output bit 10.

FIG. 6 illustrates a trellis diagram according to an embodiment of the present disclosure. Two successive trellis stages, 602 and 604, are illustrated. Each stage may comprise 64 states and two branches per state, as illustrated. The two successive trellis stages, 602 and 604 may form part of a trellis having a larger number of stages, as may be appreciated by a person skilled in the art.

All the node metrics at the first Trellis Stage, for example trellis stage 602, may be initialized to be zero, and the node metrics in the following Trellis Stages may be computed with the addition of the branch metric and the previous node metric. The branch metric may be obtained from the Euclidean distances or the squared Euclidean distances between the source data and the codewords.

When transitioning between states, moving from one state to another (represented by state transition branch), there may be an input bit and an output bit. Accordingly, each state transition branch may be indicated by an input bit and an output bit as illustrated. For example, when moving from state 1 at trellis stage 602 to state 2 at trellis stage 604, indicated by state transition branch 606, the input bit may be "0" and the output bit may be "01", indicated by "0/01".

The output bit of each state transition branch may correspond to a sub-codebook. As mentioned herein, to make the distance among sub-codebooks maximally equal, $C_0$ may be mapped to the output bit 00, $C_1$ may be mapped to the output bit 01, $C_2$ may be mapped to the output bit 11, and $C_3$ may be mapped to the output bit 10. Accordingly, each outgoing branch from a state may have a corresponding output and a corresponding sub-codebook.

In any node beginning from the second trellis stage, there are two incoming branches (as indicated earlier, two branches per state) and the node metrics may be computed based on these two incoming branches (the two incoming branches are compared with each other). The branch with the minimum node metric survives. So, the index of the survival incoming branch is saved as the $u_b$ which will be needed to trace back from the last node at the last trellis stage.

These node metric computations may be repeated and the survival path kept until the last trellis stage is reached. Once the last trellis stage is reached, the node metrics among all the nodes at the last trellis stage will be compared, and the trellis trace-back begins from the node having the minimum node metric. Since there is only one survival path saved per each node, the survival path may be easily traced back to the initial node at the first trellis stage.

Once the trace back to the first node at the first trellis stage is complete, the node index of the first node (which may be referred to as a beginning state), along with the trellis input bits (1 bit per each trellis stage) and the codeword index of the sub-codebook corresponding to each survival path may be fed back to the transmitter. It should be appreciated that a sub-codebook index has associated with it a codeword index.

Upon receiving the feedback information, the Transmitter may run the convolutional encoder with the Forward State Transition Function. Accordingly, the corresponding codewords in the trellis paths may be recovered, which may be the recovered quantized source data.

As may be appreciated by a person skilled in the art, each node may have a pair of outgoing branches. For example, at node 0 at stage 602, there may be a pair of outgoing branches 610 and 612. For each pair of the outgoing branches, the distance between the branches according to the associated sub-codebook (since output bits of each branch is mapped to a sub-codebook) may be similar. For example, the distance between the pair of branches 610 and 612 may be similar to the distance between the pair of branches 606 and 608. Similarly, the distance between the pair of branches 610 and 612 may be similar to the distance between the pair of branches 614 and 616, etc.

Figure 7:
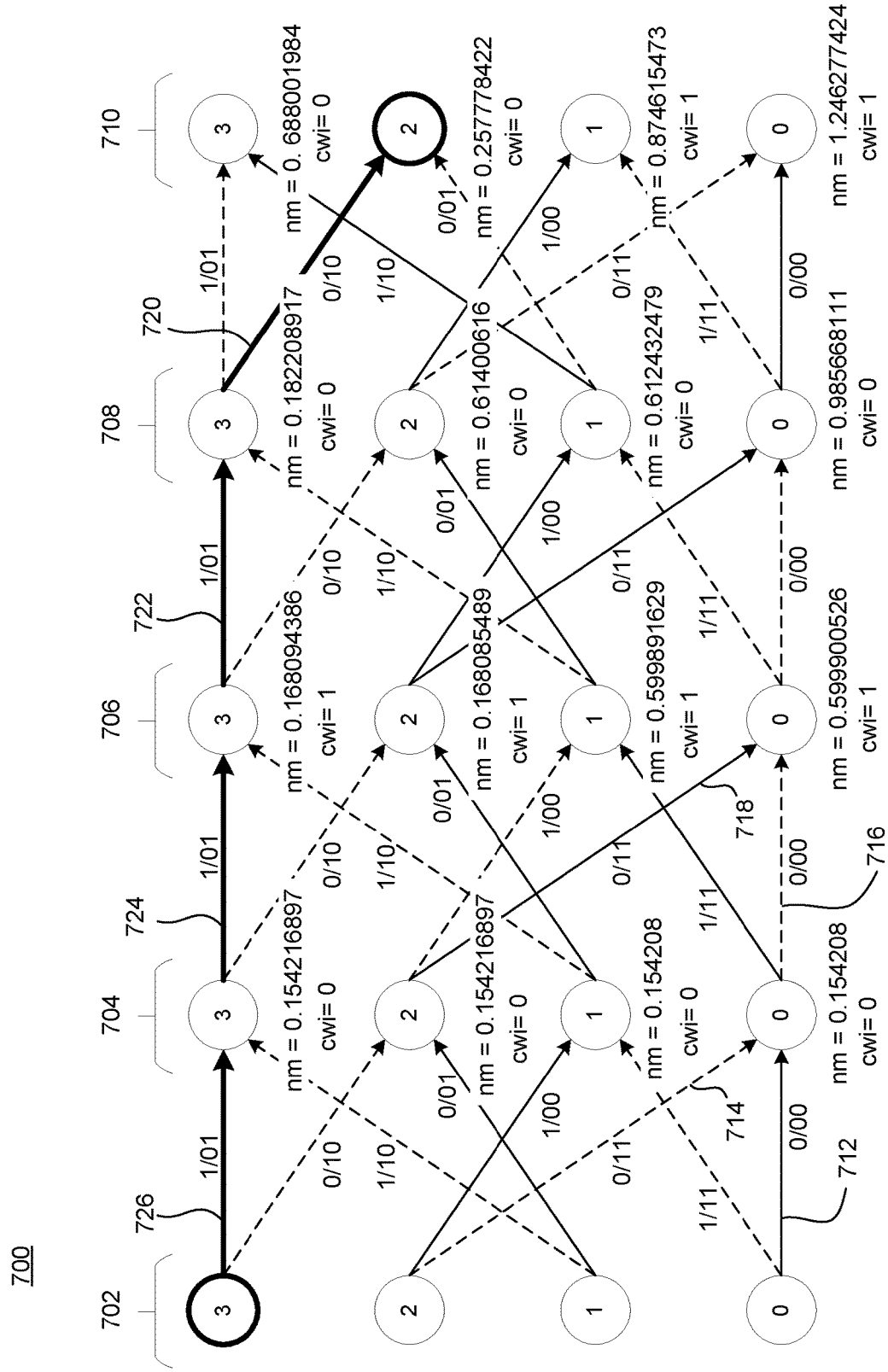
FIG. 7 illustrates another trellis diagram according to an embodiment of the present disclosure.

FIG. 7 illustrates another trellis diagram according to an embodiment of the present disclosure. The trellis 700 may be a 4-state trellis with code-rate ½ (two outgoing branch) and quantization bit size n=2 bits (N=4), as illustrated. The source data may be uniformly distributed between $L_b = -\pi$ and $U_b = \pi$. The output bit for each state transition branch or simply branch may be two bits (00, 01, 10, or 11) as illustrated. Accordingly, each branch may be indicated with an input bit and output bit as illustrated. The trellis 700 may comprise 5 stages 702, 704, 706, 708 and 710 respectively.

As mentioned herein, since code rate is ½, there may be 4 sub-codebooks, and two (=N/2) codewords in each sub-codebook. Computing sub-codebooks based on equations (3) and (4), we determine the following: $C_0$={−2.748893572, 0.392699082} which may be mapped to output bit 00; $C_1$={4.963495408, 1.1780972453} which may be mapped to output bit 01; $C_2$={−1.178097245, 1.963495408}, which may be mapped to output bit 11; and $C_3$={−0.392699082, 2.748893572}, which may be mapped to output bit 10.

Each codeword may be associated with a codeword index. Accordingly, the two codewords in each sub-codebook may be indicated by codeword indices 0 and 1, respectively.

For illustrative purposes, a source data may be assumed to comprise: $\Phi_0 = -2.3562$, $\Phi_1 = 1.2959$, $\Phi_2 = -2.0813$ and $\Phi_3 = -0.1178$.

Node metric may be based on the following:

$$\text{Node metric} = \text{Previous Node metric} + \text{Branch metric} \quad (5)$$

Wherein, $$\text{Branch metric} := (\Phi_i - C_{i,j})^2 \quad (6)$$

As mentioned herein, the branch metric may be the Euclidean distances or the squared Euclidean distances between the source data and the codewords as may be appreciated by a person skilled in the art. In equation (6), for illustrative purposes, we have indicated the squared Euclidean distance between a source data and a codeword.

Each state may have two incoming branches. For example, state 0 node, at stage 704, may have one branch 714 coming from previous state 2, at stage 702, and a second branch 712 coming from previous state 0, at stage 702.

The initial node metric, e.g., at stage 702, may be initialized to be zero. Based on equations (5) and (6), we may calculate the node metric for each state node, in the remaining trellis stages (e.g., stages 704, 706, 708 and 710). For example, for state 0 (or node 0), at trellis stage 704, we observe two incoming branches from the previous trellis stage 702, one branch 712 from state 0 and another branch 714 from state 2. To determine the node metric, we may compute node metrics based on the incoming branches 712 and 714, and use the minimum node metric as the node metric for state 0 at stage 704.

Each branch may include one input bit and two output bits illustrated as "input bit/output bit". For the branch 712 from state 0, the input bit indicates "0" and the output bit indicates "00". The output bit "00" is mapped to $C_0$={−2.748893572, 0.392699082} comprising two codewords. Accordingly, two branch metrics for branch 712, based on equation (6), using source data $\Phi_0 = -2.3562$ and codewords based on the mapped sub-codebook $C_2$, may be calculated. Similarly, two node metrics, based on equation (6) may be computed.

Provided that the initial node metric is initialized to be 0, then, the previous node metric for branch 712 is 0.

Similarly, for the branch 714 from state 2, the input bit indicates "0" and the output bit indicates "11". The output bit "11" is mapped to $C_2=\{-1.178097245, 1.963495408\}$ comprising two codewords. Accordingly, two branch metrics for branch 714, based on equation (6), using source data $\Phi_2=-2.0813$ and codewords based on the mapped sub-codebook $C_2$, may be calculated. Similarly, two node metrics, based on equation (6) may be computed. Provided that the initial node metric is initialized to be 0, then, the previous node metric for branch 714 is 0.

Upon determining the node metrics for branches 712 and 714 (a total of four node metrics) the minimum node metric may be used as the node metric for state 0 at trellis stage 704. The minimum node metric is indicated below the state in the trellis 700 as "nm", e.g., for state 0 at trellis stage 704, the node metric is "nm=0.154208".

As may be appreciated by a person skilled in the art, at each state, for example, state 0, at stage 704, the input bit for both incoming branches 712 and 714 is the same, e.g., first incoming branch 712 has input bit as 0, and second incoming branch 714 has input bit also as 0. Accordingly, the two incoming branches need to be distinguished, when traced back, for determining the survival path. If the survival path is determined to be the branch coming from the higher state, then the survival path may be indicated by, for example, 1. Similarly, if the survival path is determined to be the branch coming from the lower state, then the survival path may be indicated by, for example, 0.

The codeword index associated with the minimum branch metric (e.g., the codeword index with codeword that determine the minimum branch metric) may be saved. Further, the branch associated with the minimum branch metric may also be saved as the survival path, which for the case of state 0 at trellis stage 704 is determined to be branch 712 and indicated by solid line as illustrated.

The same approach as described with reference to state 0 at trellis stage 704 may be taken for rest of states at stage 704 (e.g., state 1, 2 and 3) and each state in the remaining stages (706, 708 and 710). The computed node metric is indicated under each state (indicated by "nm") and the survival path indicated by solid lines as illustrated. The saved codeword index associated with the minimum branch metric is also indicated under each state by "cwi".

For illustrative purposes, determination of node metric for state 0 at trellis stage 706 may be described. At state 0 (stage 706) we observe two incoming branches from the previous trellis stage 704, one branch 716 from state 0 and another branch 718 from state 2. To determine the node metric, we may compute node metrics based on the incoming branches 712 and 714 and use the minimum node metric as the node metric for state 0 at stage 706.

Similar to branch 712, the branch 716 from state 0, has input bit as "0" and the output bit as "00". The output bit "00" is mapped to $C_0=\{-2.748893572, 0.392699082\}$ comprising two codewords. Accordingly, two branch metrics for branch 716, based on equation (6), using source data $\Phi_0=-2.3562$ and codewords based on the mapped sub-codebook $C_0$, may be calculated. Similarly, two node metrics, based on equation (6) may be computed. Different from branch 712, the previous node metric for branch 716 is not 0. The previous node metric for state 0 (since branch 716 is coming from state 0), at the previous stage, e.g., stage 704, is "nm=0.154208".

For the branch 718 from state 2, similar to branch 714, input bit indicates "0" and the output bit indicates "11". The output bit "11" is mapped to $C_2=\{-1.178097245, 1.963495408\}$ comprising two codewords. Accordingly, two branch metrics for branch 718, based on equation (6), using source data $\Phi_2=-2.0813$ and codewords based on the mapped sub-codebook $C_2$, may be calculated. Similarly, two node metrics, based on equation (6) may be computed. Different from branch 714, the previous node metric for branch 718 is not zero. The previous node metric for state 2 (since the branch 718 is coming from state 2), at the previous stage, e.g., stage 704, is "nm=0.154216897".

Upon determining the node metrics for branches 716 and 718 (a total of four node metrics) the minimum node metric may be used as the node metric for state 0 at trellis stage 706. The minimum node metric is determined 0.599900526.

As mentioned, the node metric computations may be repeated and the survival path kept until the last trellis stage, stage 710, is reached. Once the last trellis stage is reached, the node metrics among all the nodes at the last trellis stage may be compared. The node, e.g., the state, having the minimum node metric, at the last trellis stage 710, may be determined to be the node at which the trellis trace-back begins. Since there are only one survival path saved per each node, the survival path may be easily traced back to the initial node at the first trellis stage.

The node having the minimum node metric at the last trellis stage 710 is determined to be node 2 having a node metric of 0.257778422, associated with branch 720 (coming from state 3 at trellis stage 708). Tracing back the survival path, along branch 720, 722, 724 and 726, the initial node (or the beginning state) at the first stage 702 may be determined to be node 3. The survival path is indicated by bold solid line as illustrated.

The input bits to convolutional encoder may be determined from the survival path comprising branches 726, 724, 722 and 720. The input bit for branches 726, 724, 722, and 720 are 1, 1, 1 and 0 respectively. Accordingly, the input bits to the convolutional encoder may comprise: {1, 1, 1, 0}.

The codewords index for the survival path may also be determined by branches 726, 724, 722 and 720. The codewords index for branches 726, 724, 722, and 720 are 0, 1, 0 and 0 respectively. Accordingly, the codewords index may comprise: {0, 1, 0, 0}.

Accordingly, the beginning state 3, the input bits {1, 1, 1, 0}, and the codewords index {0, 1, 0, 0} may be fed back to the initiator or transmitter to recover the source from the codebooks. As mentioned herein, the transmitter may run the forward state transition function to recover the survival path, including the recovered codewords. The transmitter may use the fed-back information, in combination with the mapping of the sub codebooks to output bits of the trellis to recover the codewords.

For example, the first recovered data may be associated with branch 726 of the survival path (branch 726 is the branch from the beginning state 3). Branch 726 has output bit of "01" which is mapped to sub-codebook $C_1$. Provided that the saved codeword index associated with branch 726 is "0", included as part of the fed-back information, the codeword index "0" indicates the first codeword in sub-codebook $C_1$, which is −1.963495408. Accordingly, the first recovered data may be −1.963495408. The same approach is taken for branch 724, 722 and 720 to recover the rest of source data.

The determined recovered data may be determined to be as follows: −1.963495408, 1.1780972453, −1.963495408, and −0.392699082. Despite the limited 4-state trellis example, the recovered data is observed to be reasonably close to the source data: $\Phi_0=-2.3562$, $\Phi_1=1.2959$, $\Phi_2=-$ 2.0813 and $\Phi_3 = -0.1178$. Accordingly, as the quantization bit-size is increased, the mean squared error may be reduced, as may be appreciated by a person skilled in the art.

For example, a simulation was conducted using the same convolutional scheme as defined in 802.11 and as illustrated in FIG. 5. The 802.11n channel model Chan D was generated to measure the CSI information. The phase information (magnitude information converted to the uniform distribution) was computed per each subcarrier, the phase information having a uniform distribution (magnitude information converted to the uniform distribution). TCQ was then applied to the computed phase information (magnitude information converted to the uniform distribution).

Based on 8-bit TCQ (n=8 and $N=2^8=256$), codewords were generated accordingly. For example, using equation (4), $C_0$ to $C_3$ were obtained as follows: $C_0=\{-3.135456731, -3.086369346, \ldots, 3.049553779, 3.098641164\}$; $C_1=\{-3.123184885, -3.0740975, \ldots, 3.061825625, 3.11091301\}$; $C_2=\{-3.110913039, -3.061825654, \ldots, 3.074097471, 3.123184856\}$; and $C_3=\{-3.098641193, -3.049553808, \ldots, 3.086369317, 3.135456702\}$.

The Source to Quantization Noise Ratio (SQNR) may be defined according to the following equation:

$$SQNR = 10\text{Log}\left(\frac{E(x^2)}{E(q^2)}\right) \tag{7}$$

Where x is the source data (e.g., phase information), q is the quantization noise (e.g., MSE), the units of SQNR is in (dB).

FIG. 8 illustrates performance metric between TCQ and scalar quantization (SQ), according to an embodiment of the present disclosure. Comparing the mean squared error between the applied TCQ and SQ (assuming an 8-bit quantization was used), the TCQ resulted in a smaller MSE. The MSE for TCQ and SQ were observed to be $3.98e^{-5}$ and $4.97e^{-5}$ respectively. Comparing the SQNR values, the TCQ shows an approximate 1 dB gain over the SQ. The SQNR for TCQ and SQ were observed to be 52.673 (dB) and 51.7089 (dB) respectively. This result may imply a saving of 1 bit per each subcarrier when using TCQ to obtain a similar performance as SQ.

As may be appreciated by a person skilled in the art, for an 8-bit SQ, there may be 256 total quantization levels. For 8-bit TCQ, there may be 512 total quantization levels (based on 512 codewords).

Embodiments will now describe quantization for magnitude of CSI having Rayleigh-distributed sources.

Embodiments may provide for converting Rayleigh-distributed samples into a Uniform-distributed samples. Embodiments may further provide for applying TCQ to the converted uniform-distributed samples.

As may be appreciated by a person skilled in the art, when the measured CSI (CFR) are represented in the magnitudes and phases, the magnitudes may be approximately Rayleigh-distributed, for example, as illustrated in FIG. 9A to 9D.

The statistics of Rayleigh distribution may be summarized as follows. The probability distribution function (PDF) of Rayleigh-distributed random variable (x) is:

$$f(x, \sigma) = \frac{x}{\sigma^2} e^{-\frac{x^2}{(2\sigma^2)}} \tag{8}$$

Where x is greater than or equal to 0, and $\sigma$ is the scaling factor.

The mean of x may be determined as follows:

$$\mu(x) = \sigma\sqrt{\frac{\pi}{2}}.$$

The generation of Rayleigh-distributed samples may be given from the following equation, $$x = \sigma\sqrt{-2\ln U} \tag{9}$$

where U may be uniformly distributed between 0 and 1. Hence, accordingly, to convert the Rayleigh samples into the uniform samples with a range between 0 and 1, the following equation may be applied to determine U:

$$U = e^{-x^2/(2\sigma^2)} \tag{10}$$

Where, x is the magnitude samples, $\sigma$ is the scaling factor determined according to equation (11).

Figure 9A:
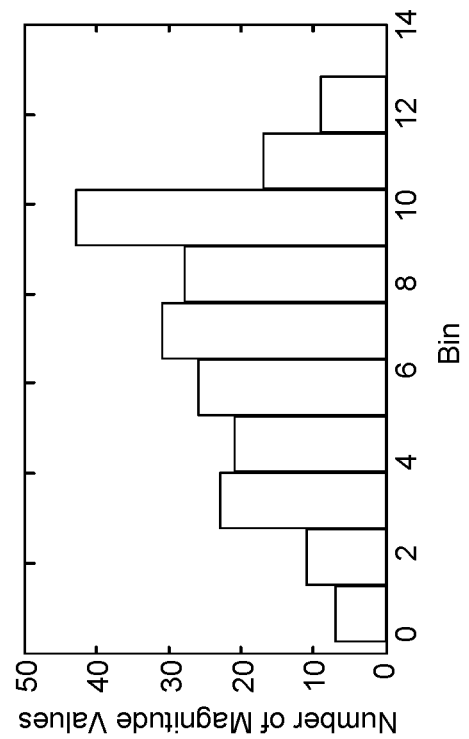
FIGS. 9A and 9B illustrate histogram per Orthogonal Frequency Division Multiplexing (OFDM) symbol of measured channel frequency response (CFR) for magnitudes of CSI, according to an embodiment of the present disclosure.
Figure 9B:
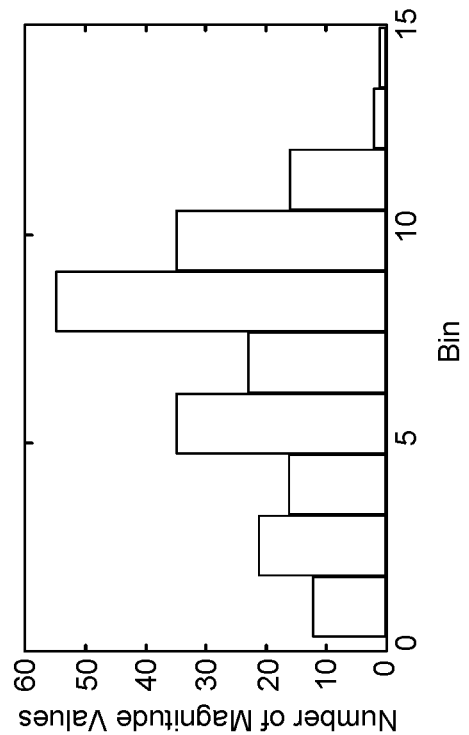

FIGS. 9A and 9B illustrate histogram per Orthogonal Frequency Division Multiplexing (OFDM) symbol of measured channel frequency response (CFR) for magnitudes of CSI, according to an embodiment of the present disclosure. As mentioned herein, channel parameters may be estimated and converted into magnitude and phase. The magnitudes may be plotted in histograms, showing PLCP Protocol Data Unit (PPDU, with PLCP being a PHY (Physical Layer) Convergence Protocol) e.g., illustrated in the FIGS. 9A and 9B histogram plots of 2 PPDUs with IEEE Chan D. As illustrated the histogram plots display a similar pattern.

As may be appreciated by a person skilled in the art, FIGS. 9A and 9B illustrate a Rayleigh-distribution of the Magnitudes of CSI. Provided the PDF of the Magnitudes, quantization of the Magnitudes of CSI may be performed as follows.

First, an average (x) over an OFDM symbol for the magnitude samples from each measured CSI per sub-carrier is taken. Accordingly, in one OFDM symbol, CSI may be measured. Using the magnitudes of measured CSI, an average may be determined.

Second, the scaling factor ($\sigma$) may be obtained as follows:

$$(\sigma) = \frac{\mu(x)}{\sqrt{\pi/2}} \tag{11}$$

Where $\mu(x)$ is the magnitude samples average obtained in the previous First step.

Third, the magnitude samples of an OFDM symbol may be converted to the uniformly-distributed samples ranged between 0 and 1 according to the equation (10). In equation (10), x is the magnitude samples, $\sigma$ is the scaling factor obtained previously, and U is the converted samples.

Once the uniformly-distributed samples U is obtained, TCQ may be applied to the U converted samples ranging between 0 and 1. The TCQ outputs and $\sigma$ may be fed back to the Initiator (e.g., a transmitter).

Upon receiving the TCQ outputs and a, the Initiator may recover the U samples from the fed-back TCQ outputs and convert the U samples to the magnitude samples x using equation (9).

A similar TCQ scheme as described in embodiments herein, including in reference to FIG. 6 and FIG. 7, may be applied to the U samples. As may be appreciated by a person skilled in the art, the range of the upper ($U_b$) and lower bound ($L_b$) may be 1 and 0, rather than π and −π.

In an example, sub-codebook of an 8-bit TCQ may be computed. The total number of states may be $N=2^8=256$. There may be 4 sub-codebooks with N/2=128 codewords in each sub-codebook. $C_0$ to $C_3$ may be obtained as follows: $C_0$={0.000976563, 0.008789063, . . . , 0.985351563, 0.993164063}; $C_1$={0.002929688, 0.010742188, . . . , 0.987304688, 0.995117188}; $C_2$={0.004882813, 0.012695313, . . . , 0.989257813, 0.997070313}; and $C_3$={0.006835938, 0.014648438, . . . , 0.991210938, 0.999023438}.

In order to make the distances among sub-codebooks maximally equal, $C_0$ may be mapped to the output bit 00, $C_1$ may be mapped to the output bit 01, $C_2$ may be mapped to the output bit 11, and $C_3$ may be mapped to the output bit 10. Accordingly, each outgoing branch from a state has a corresponding output and thus has a corresponding sub-codebook.

The Quantization of the scaling factor (σ) may be performed as follows. As may be appreciated by a person skilled in the art, the range of scaling factor may be any number larger than 0, but usually ranged between 1 and 16. If the scaling factor does not fall into this range, the process reverts back to the First step, and normalizes the measured raw CSI before computing the phase and the magnitude.

This scaling factor may be quantized once per sensing frame, and without being fed-back per each sub-carrier. So, the scaling factor may be fed-back once per sensing frame (PPDU).

As the scaling factor can be any real number greater than 0, the scaling factor may comprise a decimal or fractional part. Accordingly, the scaling factor may be separated between the integer part and the fractional (or decimal) part, and each part may be quantized separately (and feedback together). The integer part of the scaling factor may be assigned with M-bits, and the fractional part may be assigned K-bits. The fractional (or decimal) part, which is between 0 and 1, may be quantized via scalar quantization.

In an example, M may be 4 bits, and K may be 12 bits. Accordingly, M-bits may represent the integer part of the scaling factor from 1 to 16. K (=12 bits) may provide $2^{12}=4096$ quantization (scalar quantization) steps between 0 and 1. The Euclidean distance between the fractional part and each quantization level may be determined, and the index associated with the minimum Euclidean distance (among the 4096 indices) may be determined and fed back (from receiver to the transmitter).

Accordingly, for a scaling factor of, e.g., 4.7125762, the integer part "4" may be represented as "0100". The fractional (or decimal) part "0.7125762" may be quantized, via scalar quantization, by choosing a 12-digit index closest to "0.7125762". The scaling factor may be fed back as integer part and the fractional (or decimal) part according to the assigned M-bit and K-bit respectively.

FIG. 10 illustrates performance metric between TCQ and scalar quantization (SQ), according to an embodiment of the present disclosure.

A simulation was conducted using the same convolutional scheme as defined in 802.11 and as illustrated in FIG. 5. Chan D channel model was generated to measure the CSI information. Magnitude information per each subcarrier was computed (in Rayleigh Distribution). The Magnitude information were converted into Uniform distribution as described herein.

Based on 8-bit TCQ (n=8 and $N=2^8=256$), codewords were generated accordingly. Referring to FIG. 10, comparing the mean squared error between the applied TCQ and SQ (assuming an 8-bit quantization was used), the TCQ resulted in a smaller MSE. The MSE for TCQ and SQ were observed to be $2.236e^{-4}$ and $2.894e^{-4}$ respectively. Comparing the SQNR values, the TCQ shows and approximate 1 dB gain over the SQ. The SQNR for TCQ and SQ were observed to be 53.5077 (dB) and 52.3948 (dB) respectively.

Figure 11:
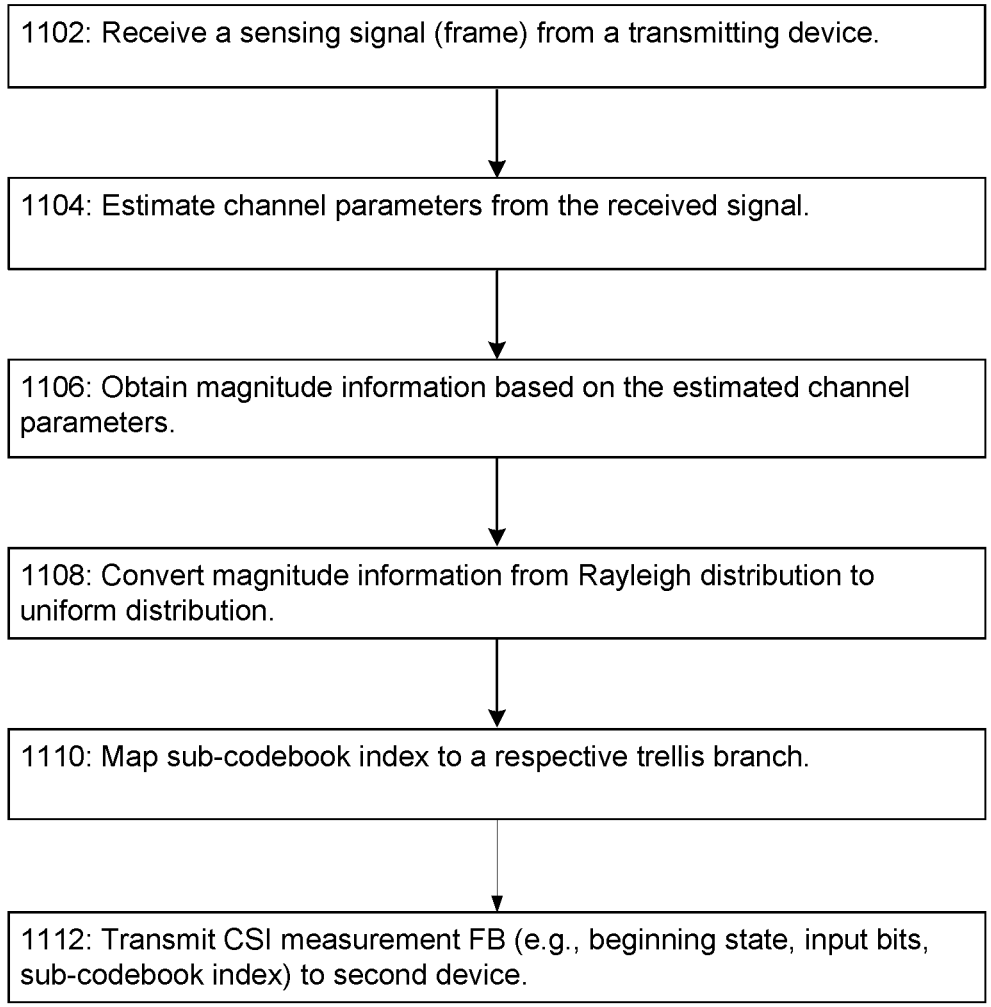
FIG. 11 illustrates operations occurring at a first device acting as a receiver providing CSI measurement feedback to a transmitter, according to an embodiment of the present disclosure.

FIG. 11 illustrates operations occurring at a first device acting as a receiver (e. g., receiver 200) providing CSI measurement feedback to a transmitter, according to an embodiment of the present disclosure.

The operations at the first device may include, at 1102 (similar to 302), receiving, from a transmitting device (e.g., transmitter 250) a sensing signal (frame). The signal may be a reference signal that is known to the receiver that is transmitted by the transmitter to assist the receiver in making its measurement of the channel.

The operations at the first device may further include, at 1104 (similar to 304), estimating channel parameters from the received signal. The first device may use the signal transmitted by the transmitter to measure the channel. Since the signal transmitted by the transmitter may be known by the reception channel (e.g., the receiver knows the transmit power level, as well as properties of the signal), the receiver may be able to estimate the channel using the signal and the measurement of the channel, producing estimated channel parameters.

The operations at the first device may further include, at 1106, obtaining magnitude information based on the estimated channel parameters. The operations at the first device may further include, at 1108, converting the magnitude information from Rayleigh distribution to uniform distribution samples as described herein.

The operations at the first device may further include, at 1110 (similar to 308), mapping sub-codebook index to a respective trellis branch. Mapping, at 1110, may involve mapping Sub-codebook index to output bits of each trellis branch in order to make the distance between Sub-codebooks maximally equal. As a result of mapping, the first device may determine, via the Viterbi Algorithm, one or more of the beginning state, input bits and sub-codebook index.

The operations at the first device may further include, at 1112 (similar to 310), transmitting CSI measurement FB (e.g., one or more of the beginning state, input bits and sub-codebook index) to the transmitter (second) device.

As described in embodiments here, depending on the trellis scheme, $C_i$ may be rearranged to make the distance between $C_i$ s maximally equal. Embodiments described herein may provide for converting magnitudes of measured CSI into the Uniform-distributed samples using the Statistics of Rayleigh distribution. Embodiments may further provide for application of TCQ to Magnitudes samples of CSI. Embodiments may further provide for quantizing scaling factor of Rayleigh-distributed magnitude samples.

Figure 12:
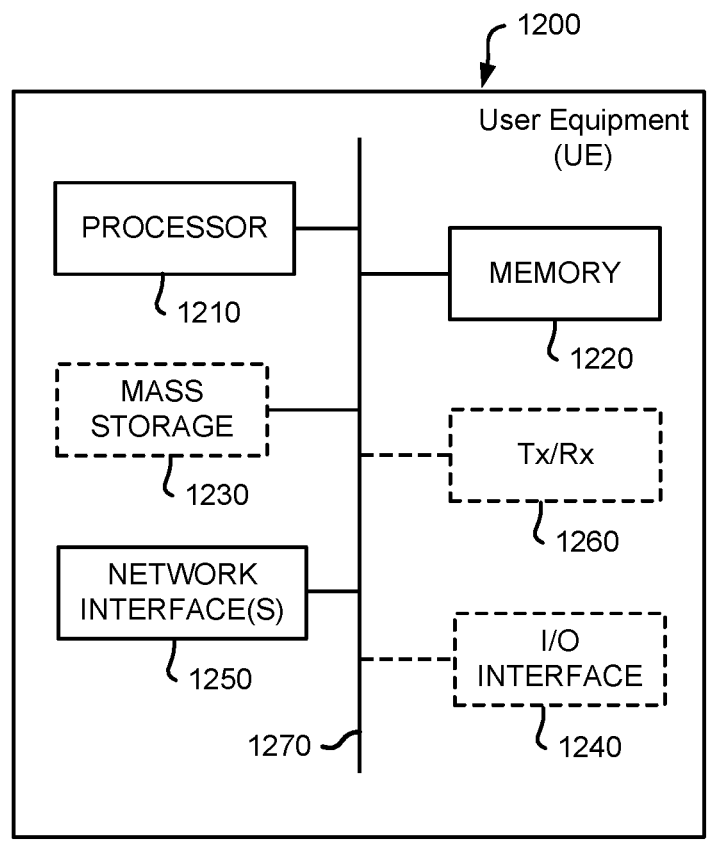
FIG. 12 is a user equipment (UE) that may perform any or all of operations of the above methods and features explicitly or implicitly described herein, according to different embodiments of the present disclosure.

FIG. 12 is a user equipment (UE) that may perform any or all of operations of the above methods and features explicitly or implicitly described herein, according to different embodiments of the present disclosure. For example, a computer equipped with network function may be configured as UE 1200. It should be appreciated that a wireless access point or node may perform any or all of operations of the above methods and features explicitly or implicitly described herein, according to different embodiments of the present disclosure.

As shown, the UE 1200 may include a processor 1210, such as a Central Processing Unit (CPU) or specialized processors such as a Graphics Processing Unit (GPU) or other such processor unit, memory 1220, non-transitory mass storage 1230, input-output interface 1240, network interface 1250, and a transceiver 1260, all of which are communicatively coupled via bi-directional bus 1270. According to certain embodiments, any or all of the depicted elements may be utilized, or only a subset of the elements. Further, UE 1200 may contain multiple instances of certain elements, such as multiple processors, memories, or transceivers. Also, elements of the hardware device may be directly coupled to other elements without the bi-directional bus. Additionally, or alternatively to a processor and memory, other electronics, such as integrated circuits, may be employed for performing the required logical operations.

The memory 1220 may include any type of non-transitory memory such as static random access memory (SRAM), dynamic random access memory (DRAM), synchronous DRAM (SDRAM), read-only memory (ROM), any combination of such, or the like. The mass storage element 1230 may include any type of non-transitory storage device, such as a solid state drive, hard disk drive, a magnetic disk drive, an optical disk drive, USB drive, or any computer program product configured to store data and machine executable program code. According to certain embodiments, the memory 1220 or mass storage 1230 may have recorded thereon statements and instructions executable by the processor 1210 for performing any of the aforementioned method operations described above.

It should be appreciated that while FIG. 12 illustrates a UE, a wireless access point or node can be similarly configured to implement the methods described herein. It should be appreciated that FIG. 12 can therefore be extended to support such a wireless access point or node.

Embodiments of the present invention can be implemented using electronics and/or photonics hardware, software, or a combination thereof. In some embodiments, the invention is implemented by one or multiple computer processors executing program instructions stored in memory. In some embodiments, the invention is implemented partially or fully in hardware, for example using one or more field programmable gate arrays (FPGAs) or application specific integrated circuits (ASICs) to rapidly perform processing operations.

It will be appreciated that, although specific embodiments of the technology have been described herein for purposes of illustration, various modifications may be made without departing from the scope of the technology. The specification and drawings are, accordingly, to be regarded simply as an illustration of the invention as defined by the appended claims, and are contemplated to cover any and all modifications, variations, combinations or equivalents that fall within the scope of the present invention. In particular, it is within the scope of the technology to provide a computer program product or program element, or a program storage or memory device such as a magnetic or optical wire, tape or disc, or the like, for storing signals readable by a machine, for controlling the operation of a computer according to the method of the technology and/or to structure some or all of its components in accordance with the system of the technology.

Acts associated with the method described herein can be implemented as coded instructions in a computer program product. In other words, the computer program product is a computer-readable medium upon which software code is recorded to execute the method when the computer program product is loaded into memory and executed on the microprocessor of the wireless communication device.

Further, each operation of the method may be executed on any computing device, such as a personal computer, server, PDA, or the like and pursuant to one or more, or a part of one or more, program elements, modules or objects generated from any programming language, such as C++, Java, or the like. In addition, each operation, or a file or object or the like implementing each said operation, may be executed by special purpose hardware or a circuit module designed for that purpose.

Through the descriptions of the preceding embodiments, the present invention may be implemented by using hardware only or by using software and a necessary universal hardware platform. Based on such understandings, the technical solution of the present invention may be embodied in the form of a software product. The software product may be stored in a non-volatile or non-transitory storage medium, which can be a compact disk read-only memory (CD-ROM), USB flash disk, or a removable hard disk. The software product includes a number of instructions that enable a computer device (personal computer, server, or network device) to execute the methods provided in the embodiments of the present invention. For example, such an execution may correspond to a simulation of the logical operations as described herein. The software product may additionally or alternatively include number of instructions that enable a computer device to execute operations for configuring or programming a digital logic apparatus in accordance with embodiments of the present invention.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

What is claimed is:

1. A method, by a receiver, comprising:

receiving a signal from a transmitter, via a communication channel between the receiver and the transmitter;

estimating parameters associated with the channel based on the received signal;

obtaining phase information from the estimated parameters;

applying a trellis coded quantization (TCQ) scheme to the obtained phase information by mapping each sub-codebook index of a set of sub-codebook indices to output bits of each trellis branch making the distance between sub-codebooks maximally equal; and transmitting a channel state information (CSI) measurement feedback to the transmitter, the CSI measurement feedback based on the TCQ scheme and comprising one or more of:

a beginning state, input bits to the TCQ scheme, and a sub-codebook index.

2. The method of claim 1 further comprising: executing a Viterbi algorithm (VA) to obtain the CSI measurement feedback.

3. The method of claim 1, wherein the set of sub-codebook indices comprises 4 sub-codebook indices.

4. The method of claim 1, wherein each sub-codebook of the set of sub-codebooks comprises a set of codewords generated via:

$c_{i,l} = L_b + l\Delta + (i + 0.5)\delta$, wherein:

$c_{i,l}$ is the $l$-th codeword in sub-codebook $C_i$, $i$-th ($0 <= i <= 3$) sub-codebook is denoted as $C_i$;

$C_i = \{c_{i,l}\}_{l=0}^{\frac{N}{2}-1}$;

$c_{i,l} = L_b + l\Delta + (i + 0.5)\delta$;

$N = 2^n$;

$n = $ bit size of the $TCQ$ scheme;

$\Delta = \dfrac{U_b - L_b}{N/2}$;

$\delta = \dfrac{U_b - L_b}{2N}$;

and $L_b$ and $U_b$ are, respectively, lower bound and upper bound of the obtained phase information.

5. The method of claim 4, wherein $L_b$ is $-\pi$ and $U_b$ is $\pi$.

6. The method of claim 1, wherein the TCQ scheme has a code-rate of 1/2.

7. The method of claim 1, wherein the input bits indicate a survival path from the beginning state.

8. A method, by a receiver, comprising:
receiving a signal from a transmitter, via a communication channel between the receiver and the transmitter;
estimating parameters associated with the channel based on the received signal;
obtaining magnitude information from the estimated parameters;
converting the magnitude information from Rayleigh distribution to uniform distribution;
applying a trellis coded quantization (TCQ) scheme to the converted magnitude information by mapping each sub-codebook index of a set of sub-codebook indices to output bits of each trellis branch in order to make the distance between sub-codebooks maximally equal; and
transmitting a channel state information (CSI) measurement feedback to the transmitter, the CSI measurement feedback based on the TCQ scheme and comprising one or more of:
a beginning state, input bits to the TCQ scheme, and a sub-codebook index.

9. The method of claim 8 further comprising: executing a Viterbi algorithm (VA) to obtain the CSI measurement feedback.

10. The method of claim 8, wherein the set of sub-codebook indices comprises 4 sub-codebook indices.

11. The method of claim 8, wherein each sub-codebook of the set of sub-codebooks comprises a set of codewords generated via:

$c_{i,l}=L_b+l\Delta+(i+0.5)\delta$, wherein:

$c_{i,l} = L_b + l\Delta + (i + 0.5)\delta$, wherein:

$c_{i,l}$ is the $l$-$th$ codeword in sub-codebook $C_i$, $i$-$th$ ($0 <= i <= 3$) sub-codebook is denoted as $C_i$;

$C_i = \{c_{i,l}\}_{l=0}^{\frac{N}{2}-1}$;

$c_{i,l} = L_b + l\Delta + (i + 0.5)\delta$;

$N = 2^n$;

$n = $ bit size of the $TCQ$ scheme;

$\Delta = \dfrac{U_b - L_b}{N/2}$;

$\delta = \dfrac{U_b - L_b}{2N}$;

and $L_b$ and $U_b$ are, respectively, lower bound and upper bound of the converted magnitude information.

12. The method of claim 11, wherein $L_b$ is 0 and $U_b$ is 1.

13. The method of claim 8, wherein the converting is performed via:

$$U = e^{-\frac{x^2}{(2\sigma^2)}},$$

wherein:
U is the converted magnitude information uniformly distributed between 0 and 1;
σ is a scaling factor as determined according to:

$$\sigma = \frac{\mu(x)}{\sqrt{\pi/2}};$$

μ(x) is an average over an OFDM symbol for a portion of the magnitude information from each measured CSI per sub-carrier; and
x is the magnitude information.

14. The method of claim 13, wherein the transmitting comprises transmitting the scaling factor.

15. The method of claim 14, wherein the scaling factor is quantized once per sensing frame.

16. The method of claim 14, wherein the scaling factor comprises an integer part and a decimal part.

17. The method of claim 16, wherein the integer part and the decimal part are quantized separately.

18. The method of claim 17, wherein the decimal part is quantized using a scalar quantization.

19. The method of claim 14 further comprising:
recovering, by the transmitter, the converted magnitude information; and
reconverting the magnitude information according to: $x=\sigma\sqrt{-2\ln U}$.

20. A wireless device comprising:
a receiver;
a processor; and
a non-transitory memory storing machine executable instructions, which when executed by the processor, configure the device for:
receiving a signal from a transmitter, via a communication channel between the receiver and the transmitter;
estimating parameters associated with the channel based on the received signal;
obtaining phase information from the estimated parameters;

applying a trellis coded quantization (TCQ) scheme to the obtained phase information by mapping each sub-codebook index of a set of sub-codebook indices to output bits of each trellis branch making the distance between sub-codebooks maximally equal; and transmitting a channel state information (CSI) measurement feedback to the transmitter, the CSI measurement feedback based on the TCQ scheme and comprising one or more of: a beginning state, input bits to the TCQ scheme, and a sub-codebook index.

\* \* \* \* \*

UNITED STATES PATENT AND TRADEMARK OFFICE
CERTIFICATE OF CORRECTION

PATENT NO. : 11,949,480 B2
APPLICATION NO. : 17/307031
DATED : April 2, 2024
INVENTOR(S) : Jung Hoon Suh et al.

It is certified that error appears in the above-identified patent and that said Letters Patent is hereby corrected as shown below:

In the Specification

Column 12, Line 19, "put bit 00; $C_1$ = {4.963495408, 1.1780972453} which may be" should read --put bit 00; $C_1$ = {-1.963495408, 1.1780972453} which may be--;

Column 12, Line 66, "mapped sub-codebook $C_2$, may be calculated. Similarly, two" should read --mapped sub-codebook $C_0$, may be calculated. Similarly, two--;

Column 16, Line 61, "Upon receiving the TCQ outputs and a, the Initiator may" should read --Upon receiving the TCQ outputs and $\sigma$, the Initiator may--;

In the Claims

Column 21, Line 59, "$c_{i,l}=L_b+l\Delta+(i+0.5)\delta$, wherein:" is duplicate of Line 63 and should be removed.

Signed and Sealed this
Eleventh Day of February, 2025

Coke Morgan Stewart
*Acting Director of the United States Patent and Trademark Office*